United States Patent
Hu et al.

(10) Patent No.: US 7,233,325 B2
(45) Date of Patent: Jun. 19, 2007

(54) STRUCTURE AND METHOD FOR REDUCING SOURCE LINE RESISTANCE OF LIGHT EMITTING DIODE

(75) Inventors: Jen-Yi Hu, Taipei Hsien (TW); Wein-Town Sun, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 512 days.

(21) Appl. No.: 10/707,012

(22) Filed: Nov. 13, 2003

(65) Prior Publication Data

US 2004/0104687 A1 Jun. 3, 2004

(30) Foreign Application Priority Data

Dec. 3, 2002 (TW) .............................. 91135004 A

(51) Int. Cl.
*G09G 3/30* (2006.01)
(52) U.S. Cl. ..................... 345/204; 345/39; 345/46; 345/205; 315/169.3; 349/138
(58) Field of Classification Search .................. 345/39, 345/46, 76, 82, 84, 204, 205; 315/169.3; 349/138; 438/149, 151
See application file for complete search history.

(56) References Cited

U.S. PATENT DOCUMENTS

| | | | | |
|---|---|---|---|---|
| 4,742,254 A | * | 5/1988 | Tomisawa | .................... 327/284 |
| 6,133,103 A | * | 10/2000 | Lee et al. | .................... 438/276 |
| 6,144,584 A | * | 11/2000 | Kunori et al. | ......... 365/185.18 |
| 6,219,118 B1 | * | 4/2001 | Zhang | ........................ 349/110 |
| 6,380,636 B1 | * | 4/2002 | Tatsukawa et al. | ......... 257/390 |
| 6,875,645 B2 | * | 4/2005 | Lai | ............................ 438/151 |
| 2002/0140643 A1 | * | 10/2002 | Sato | ............................ 345/76 |
| 2004/0017162 A1 | * | 1/2004 | Sato et al. | ................ 315/169.3 |

* cited by examiner

*Primary Examiner*—Bipin Shalwala
*Assistant Examiner*—Vincent E. Kovalick
(74) *Attorney, Agent, or Firm*—Jianq Chyun IP Office

(57) ABSTRACT

A structure and a method for reducing source line resistance of a light emitting diode. A light emitting diode display has at least a light emitting diode, a power source and a power source line structure for guiding the power source to provide the required power for driving the light emitting diode. The structure for reducing the source line resistance has an insulation layer formed on at least a part of the source line structure. The insulation layer has at least two openings exposing the source line structure. A conductive layer is formed to cover the insulation layer and is in electrical contact with the source line structure through the openings. Thereby, the conductive layer and the source line are connected in parallel, and the resistance of the source line is thus reduced.

12 Claims, 5 Drawing Sheets

STRUCTURE AND METHOD FOR REDUCING SOURCE LINE RESISTANCE OF LIGHT EMITTING DIODE

CROSS REFERENCE TO RELATED APPLICATIONS

This application claims the priority benefit of Taiwan application serial no. 91135004, filed Dec. 03, 2002.

BACKGROUND OF INVENTION

1. Field of the Invention

The invention relates in general to a light emitting device display technique, and more particularly, to an organic light emitting diode (OLED) for reducing power source resistance. Thereby, a stable and uniform driving voltage is supplied to each pixel of the organic light emitting diode.

2. Related Art of the Invention

Following with the advancement in high-tech, video products, particularly digital video products or image apparatus have become one of the most common products in our daily lives. Among various video products or image apparatus, the display is an important device for information display. The user can read information from a display, or even control the operation of an apparatus.

To compliment the modern life style, the video products or image apparatus are developed thinner and lighter. The traditional cathode ray tube display, though having certain advantages, has been replaced by flat panel display fabricated by optoelectronic and semiconductor process due to the large volume and power consumption. The commonly seen flat panel display includes liquid crystal display or active organic matrix light emitting diode, for example.

The technique of liquid crystal display has been developed for years and a breakthrough is hard to attain. The organic light emitting diode technique has thus become the main stream of modern flat panel display. The characteristics of the organic light emitting diode includes forming the thin-film transistor (TFT) driving technique to drive the light emitting diode, and forming the driving IC on the panel directly to achieve the objectives of being light, thin, short and small, and low-power consumption. The organic light emitting diode can be applied to the small and medium sized panels of cellular phones, personal data assistant (PDA), digital camera, game boy, portable DVD player and vehicle navigation systems. The application of the organic light emitting diode may further include larger area flat panel displays such as computer and television screens.

The digitalized display is characterized in constructing the display screen with a plurality of pixels arranged as an array. To control each individual pixel unit, a scan line and a data line are formed to select the specific pixel and to provide appropriate operating voltage thereto, so as to display information corresponding to the selected pixel.

FIG. 1 shows a schematic diagram of a circuit for driving the pixel array of an organic light emitting diode. The display can normally be categorized into an active type and a passive type. The following provides description of a passive circuit. Referring to FIG. 1, the scan line is connected to the gate of each thin-film transistor 100 for each pixel. Within a frame time, the scan line is switched on. The data line is connected to a source/drain region of each thin-film transistor 100 to supply a voltage to the corresponding pixel for data input. The voltage is maintained by the capacitor 110, and the thin-film transistor 104 is switched on. Meanwhile, the source line 116 converts a power source Vdd into a current via a source current source thin-film transistor 104. The current flows through the light emitting diode 108 for generating light. Therefore, the voltage of a data line determines the light, including the gray scale thereof, emitted from the pixel.

An image is typically constructed by a plurality of pixels arranged as a two-dimensional array, for example, 640×480 pixels. In other words, one source line 116 may provide a voltage to all the light emitting diodes 108 in a row or a column. Although the source line 116 is made of a conductive material such as polysilicon, the source line 116 still has certain resistance. Therefore, for a source line 116 with long extension, the voltage applied to the first pixel is larger than that applied to the last pixel. As the area of the panel increases, this voltage difference becomes more significant. FIG. 2 shows the structure of a conventional source line. The source line 116 extends across the scan line 112 and is connected to the thin-film transistor via the plug 120. The scan line 112 and the source line 116 are isolated from each other by an insulation layer (not shown). The source line 116 is typically made of polysilicon. The insulation layer includes a conductive plug 120 coupled with the source line 116. When a driving voltage Vdd is applied across the source line 116, a voltage drop is typically caused by the resistance of the source line 116. The source line 116 may be formed of material with high conductivity. However, the process may be more complex, and the cost is increased. As polysilicon material can be defined together with other relative devices of the thin-film transistor, so that not a lot of additional process is required by forming the polysilicon source line. However, the conductivity of polysilicon source line with long extension may cause voltage drop due to the internal resistance thereof.

Therefore, the brightness of the light emitting diode 108 is often varied according to the driving voltage Vdd. In the above conventional design, the uniformity of the panel brightness is always a challenge. As the driving method for organic light emitting diode requires a current source thin-film transistor 104 to convert the driving voltage into a current, the stability of the voltage directly affects the current flowing to the organic light emitting. Particularly, following the trend of increasing panel dimension, the pixel line is longer, and the line resistance is larger causing non-uniform brightness.

SUMMARY OF INVENTION

The present invention provides a structure and a method for reducing source line resistance. A conductive layer and the source line are connected in parallel to reduce the resistance, such that the voltage drop across the source line is reduced. Therefore, the voltage distribution of the pixel is more uniform, and the problem of non-uniform brightness is improved.

The present invention provides a structure and a method for reducing source line resistance, so as to improve uniformity of driving voltage for each pixel of the panel. Therefore, the power consumption is reduced. Further, the corresponding current uniformity and power consumption can also be improved.

The design of the present invention reduces the source line resistance without changing the material of the source line. The parallel connecting structure can be disposed at the source sensitive area to reduce the voltage drop of the power source.

The present invention provides a structure for reducing source line of a light emitting display that comprises at least a light emitting diode, a power source and a source line which supplies required power source for driving the light emitting diode. An insulation layer is formed on at least a part of the source line. The insulation layer includes at least two openings exposing the source line structure. A conductive layer is formed to cover the insulation layer and electrically connected to the source line through the openings. The conductive layer and the source line thus are partly connected in parallel. The parallel connection between the conductive layer and the source line thus reduces the resistance of the source line.

The present invention provides a method for reducing source line resistance of a light emitting display in which a plurality of pixels is formed. Each of the pixels comprises a light emitting diode and a source line to lead a power source for supplying the required power for driving the light emitting diode. The method for reducing the source line resistance includes the following steps. An insulation layer is formed on the source line. A plurality of openings is formed in the insulation layer to expose the underlying source line. A conductive layer is formed to cover the insulation layer and fill the openings. Therefore, the conductive layer is in electrical contact with the source line through the openings.

BRIEF DESCRIPTION OF DRAWINGS

These, as well as other features of the present invention, will become more apparent upon reference to the following drawings.

DETAILED DESCRIPTION

The present invention is characterized in connecting a conductive layer and at least a part of a source line in parallel to reduce the source line resistance, so as to reduce the voltage drop of the driving voltage supplied from the source line to the pixel.

Figure 3:
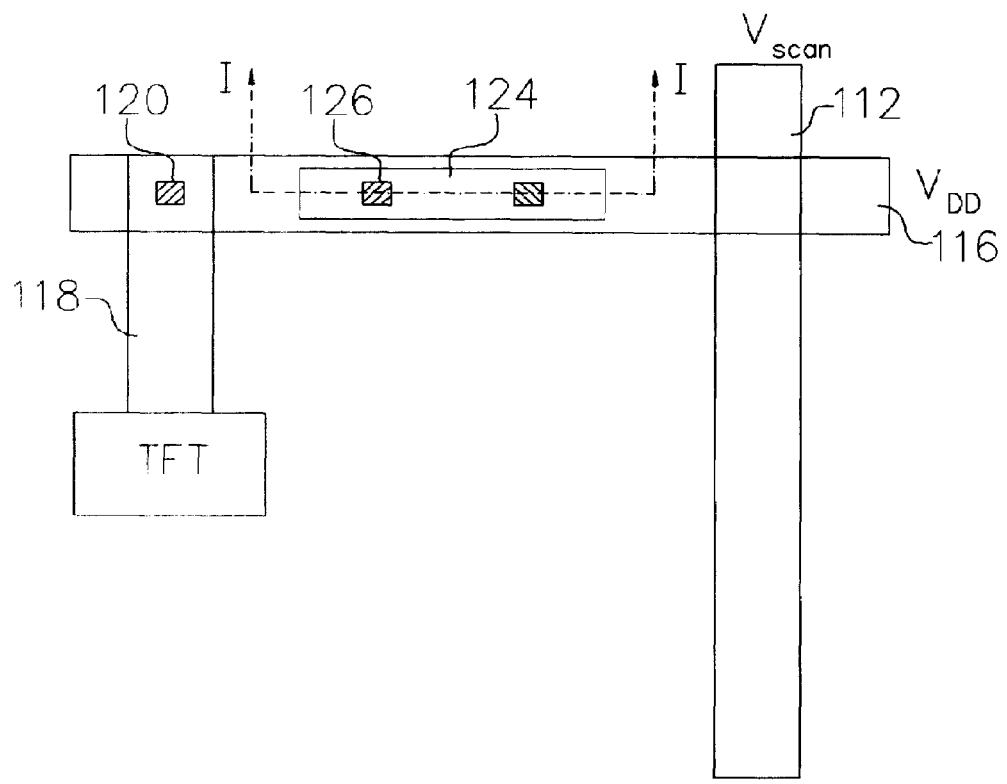
FIG. 3 shows a top view of a source line according to the present invention.
Figure 4:
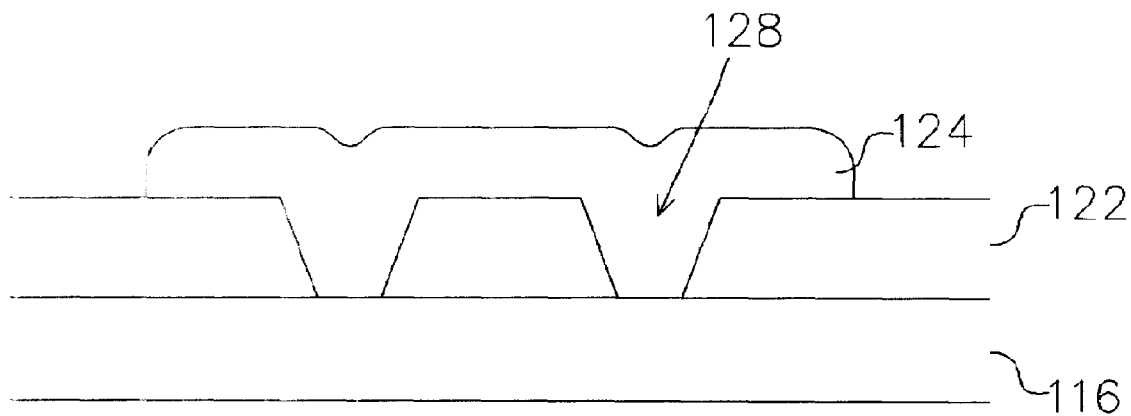
FIG. 4 shows a cross sectional view along the line 1—1 as shown in FIG. 3.

The driving circuit of a display panel typically comprises scan lines and data lines. To enhance driving speed, the scan lines and the data lines are normally made of materials with lower resistivity such as metal conductors. Meanwhile, the source line is normally made of material with relatively larger resisitivity such as polysilicon. FIG. 3 shows a top view of a source line according to the present invention. To reduce the source line resistance, an additional conductive layer is formed without introducing additional photolithography masking process. As shown in FIG. 3, a conductive layer 124 is electrically connected with a source line 116 in parallel via a plug 126. FIG. 4 shows a cross-sectional view along line 1—1 as shown in FIG. 3. An insulation layer or a dielectric layer 122 is formed on the source line 116. Two openings 128 are formed in the insulation layer 122 to expose the source line 116. The conductive layer 124 is formed on the insulation layer 122 to fill the openings 128. Therefore, the conductive layer 124 and at least a part of the source line 116 are connected to each other in parallel. The conductive layer 124 is normally made of a material with conductivity higher than that of the source line 11 6.

Figure 1:
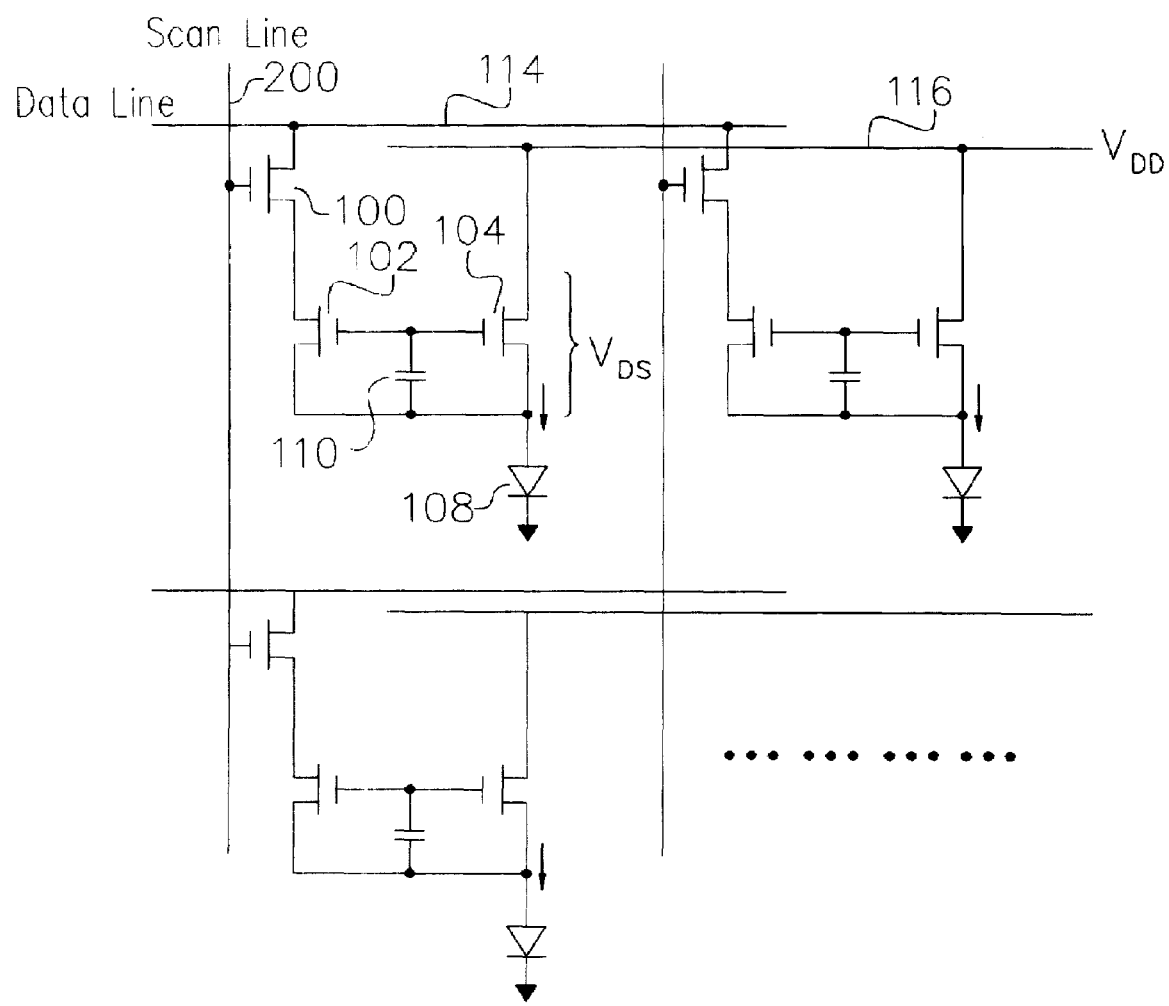
FIG. 1 shows a schematic drawing a conventional driving circuit of a pixel array of an organic light emitting diode.
Figure 2:
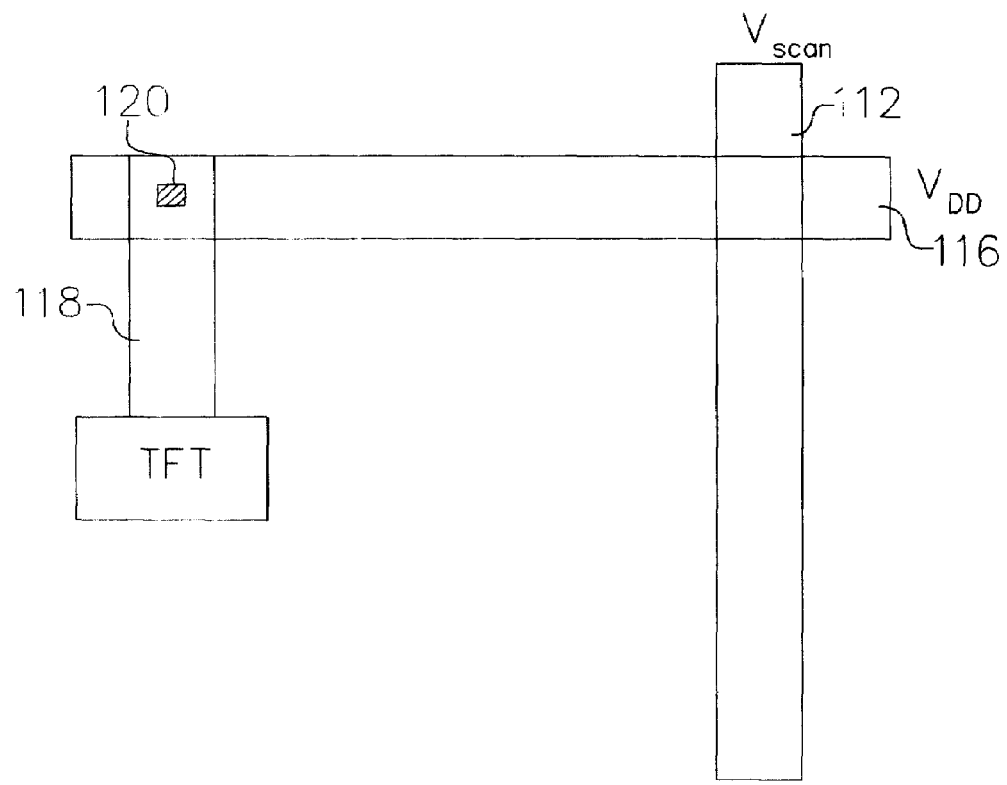
FIG. 2 shows a top view of a conventional source line.
Figure 6:
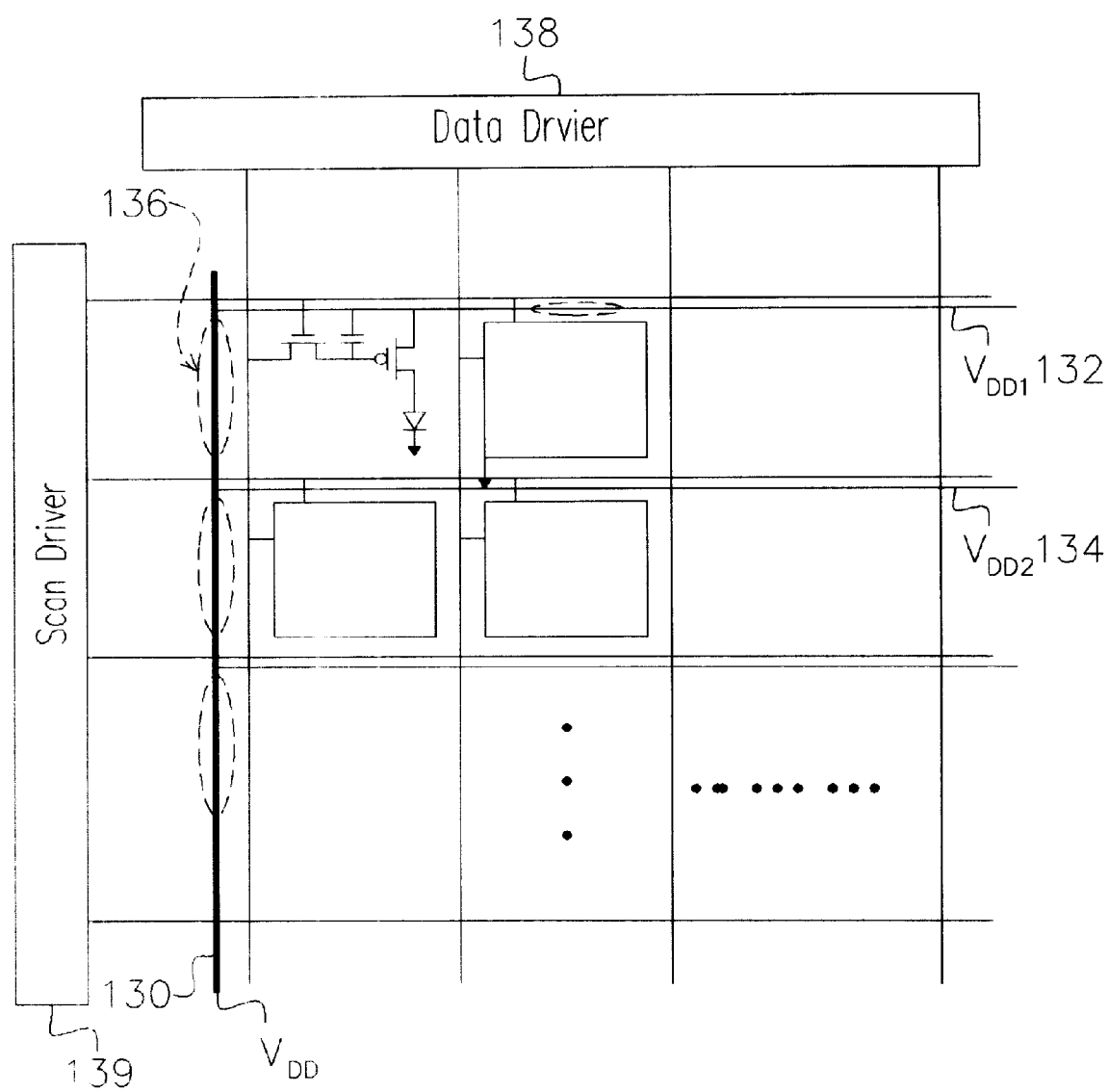
FIGS. 6 and 7 shows two layouts of a source line according to the present invention.
Figure 7:
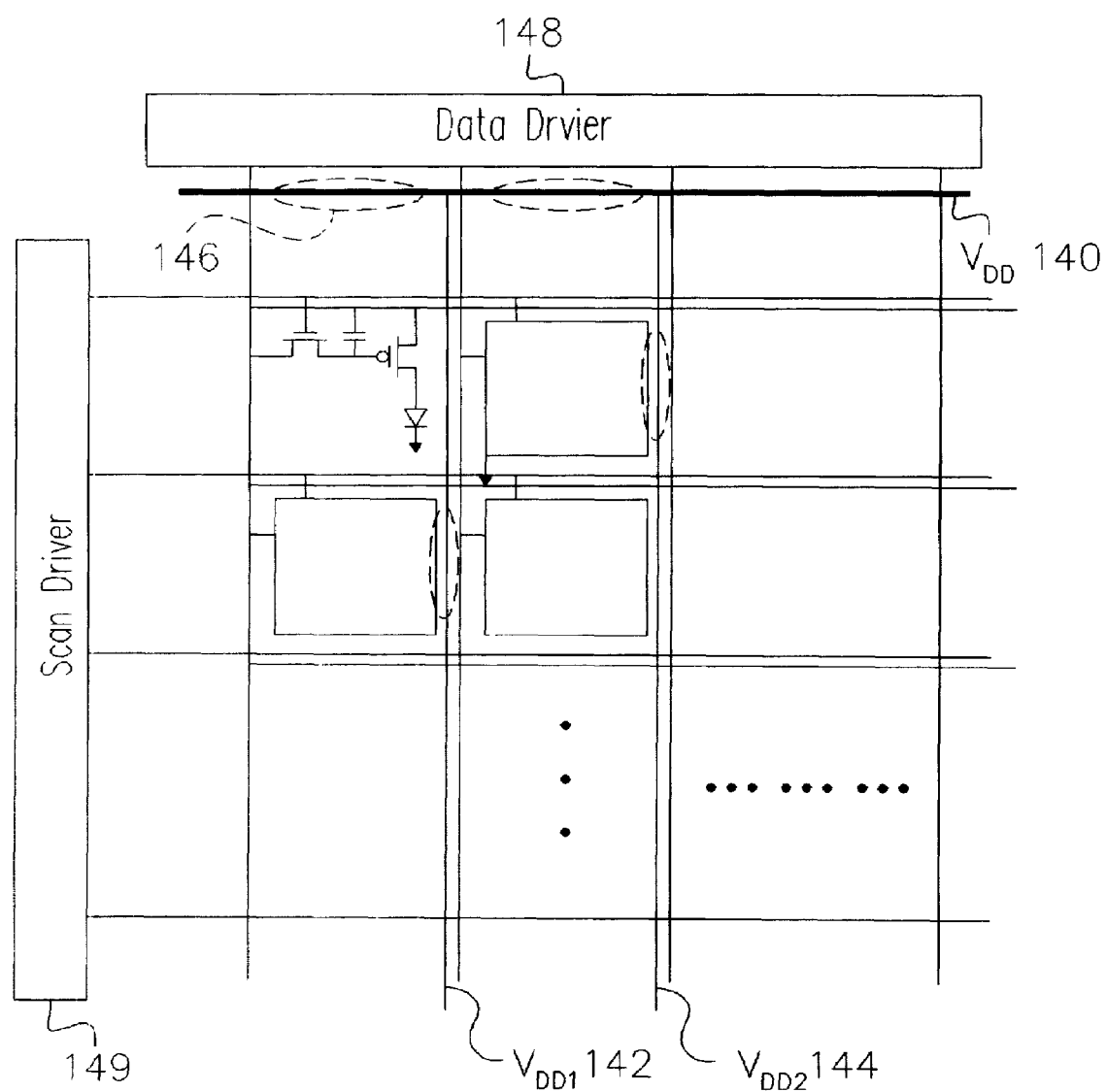

In FIG. 4, a part of the source line 116 is illustrated. However, for the whole circuit, the source line 116 may have various parts or structures such as that as shown in FIGS. 1, 6 and 7. Based on the similarly design principle, the conductive layer 124 can be divided into a plurality of segments scattered at the desired area of the pixels to be improved. The conductive layer 124 can also extend above most of the source line 116 and include a plurality of plugs 126. The neighboring two plugs construct a parallel connecting structure to reduce the resistance. Preferably, the parallel connecting structure is not located at the crossed lines. FIG. 6 and FIG. 7 will provide a more detailed description thereof.

The conductive layer 124 and the plugs 126 can be treated as a conductor structure. By the semiconductor photolithography and etching process, at least two openings 128 are formed in the insulation layer 122. Generally, the openings 128 are formed at two ends of a required parallel connecting structure. During the process for forming the conductive layer 124, the openings 128 are filled thereby. The conductive layer 124 and the plugs 126 can be formed integrally. However, as required, the plugs 126 can be formed separately. Various processes are available for fabricating the design for reducing the source line within the scope of the present invention.

As mentioned above, the conductive layer 124 can be formed over the source line to form parallel connecting structures for different segments. In other words, a single conductive layer 124 may include at least two plugs to construct a part of the parallel connecting structure under the same principle as shown in FIG. 4.

Figure 5:
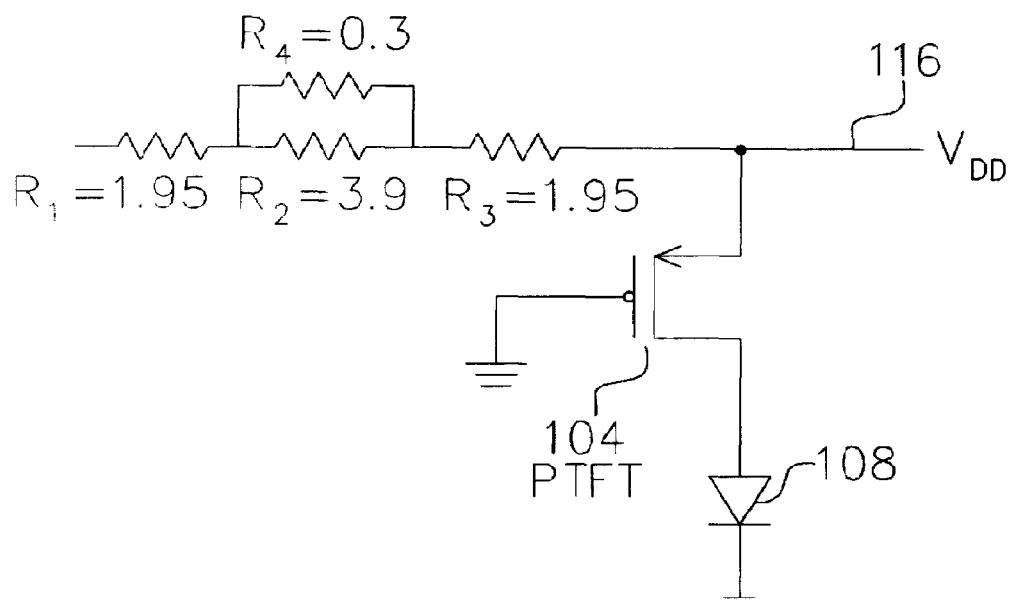
FIG. 5 shows an equivalent circuit of a resistor according to the present invention.

FIG. 5 shows an equivalent circuit of a resistor according to the present invention. The resistor R4 is the parallel resistor constructed by the conductive structure provided by the present invention. According to the pixel structure, when a voltage of 1 0V is applied to the source line, the simulation shows an effective reduction of source line resistance. For an array having 320 pixels, the conventional design results in a voltage of 8.5V at the last pixel ($320^{th}$) of the array. However, according to the design as shown in FIG. 5, the voltage of the $320^{th}$ pixel is maintained at 9.24V.

For the overall design of the pixel, two layouts of the source line are shown in FIGS. 6 and 7. In FIG. 6, the source line structure includes a major source line 130 and a plurality of branch lines 132, 134. The major source line 130 is connected to a power source Vdd, which is supplied to the light emitting diode of each pixel via the branch lines 132 and 134. The major source line 130 is across the scan lines, while the branch lines provide a driving voltage to each pixel. To reduce source line resistance, an appropriate part can be selected to form the parallel connecting structure. To consider device planarity, the position of the parallel connecting structure may be disposed over the non-crossing lines such as the position denoted by 136. The position can also be located over the branch line. Basically, the position is located between pixels.

FIG. 7 is another arrangement of the source line. The major source line 140 is across the data lines, while the branch lines 142, 144 provide driving voltages to the pixels. With the same design, parallel connecting structures can be formed in the appropriate segment to reduce the source line resistance.

As a conclusion, the present invention provides a structure and a method for reducing source line resistance. A conductive layer is connected to the source line in parallel, such that the path for the driving voltage has a lower voltage drop. The voltage distribution among the pixels is more uniform to improve the problem of non-uniform brightness.

The present invention provides a structure and a method for reducing source line resistance that improves the uniformity of driving voltage applied to each pixel and reduces power consumption. Thereby, the current uniformity is enhanced.

The design of the present invention reduces the source line resistance without changing the source line material. The parallel connecting structure can be located at the sensitive area of the source to reduce the source bias.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

The invention claimed is:

1. A structure of reducing source line resistance, suitable for use in a light emitting diode display that comprises a plurality of pixels, each of which comprises a light emitting diode, a source and a source line for providing required power to drive the light emitting diode, the structure comprising:
    an insulation layer on the source line, the insulation layer having at least two openings exposing two ends of a part of the source line; and
    at least a conductive layer covering the insulation layer and electrically connected to the source line via the openings, such that the conductive layer and at least the part of the source line are connected in parallel,
    wherein the source line further comprises a major source line to connect with the source and a plurality of branch lines to supply the power to the light emitting diode of each pixel, and the conductive layer comprises at least a conductor located over the branch lines.

2. The structure according to claim 1, wherein the conductivity of the conductive layer is larger than that of the source line.

3. The structure according to claim 1, wherein the conductive layer comprises a plurality of conductive structures distributed between the pixels.

4. A structure of reducing source line resistance, suitable for use in a light emitting diode display that comprises a plurality of pixels, each of which comprises a light emitting diode, a source and a source line for providing required power to drive the light emitting diode, the structure comprising:
    an insulation layer on the source line, the insulation layer having a plurality of openings exposing the source line; and
    a conductive layer covering the insulation layer and electrically connected to the source line via the openings, such that the conductive layer and at least the part of the source line are connected in parallel,
    wherein the source line further comprises a major source line to connect with the source and a plurality of branch lines to supply the power to the light emitting diode of each pixel, and the conductive layer comprises at least a conductor located over the branch lines.

5. The structure according to claim 4, wherein the conductivity of the conductive layer is larger than that of the source line.

6. The structure according to claim 4, wherein the openings are distributed between the pixels.

7. A method of reducing source line resistance, suitable for use in a light emitting diode display that comprises a plurality of pixels, each of which comprises a light emitting diode, a source and a source line for providing required power to drive the light emitting diode, wherein the source line further comprises a major source line to connect with the source and a plurality of branch lines to supply the power to the light emitting diode of each pixel, the method comprising:
    forming an insulation layer on the source line;
    forming a plurality of openings exposing the source line; and
    forming a conductive layer covering the insulation layer and electrically connected to the source line via the openings, such that the conductive layer and at least the part of the source line are connected in parallel, wherein the conductive layer comprises at least a conductor formed over the branch lines.

8. The method according to claim 7, wherein the conductivity of the conductive layer is larger than that of the source line.

9. The method according to claim 7, wherein two neighboring ones of the openings are formed on two ends of a part of the source line.

10. The method according to claim 7, wherein the step of forming the conductive layer further comprises forming a plurality of conductive segments to fill the openings.

11. A structure of reducing source line resistance, suitable for use in a light emitting diode display that comprises a plurality of pixels, each of which comprises a light emitting diode, a source and a source line for providing required power to drive the light emitting diode, the structure comprising:
    an insulation layer on the source line, the insulation layer having at least two openings exposing two ends of a part of the source line; and
    at least a conductive layer covering the insulation layer and electrically connected to the source line via the openings, such that the conductive layer and at least the part of the source line are connected in parallel,
    wherein the source line further comprises a major source line to connect with the source and a plurality of branch lines to supply the power to the light emitting diode of each pixel, and the conductive layer comprises at least a conductor located over the major source line.

12. A structure of reducing source line resistance, suitable for use in a light emitting diode display that comprises a plurality of pixels, each of which comprises a light emitting diode, a source and a source line for providing required power to drive the light emitting diode, the structure comprising:
    an insulation layer on the source line, the insulation layer having a plurality of openings exposing the source line; and
    a conductive layer covering the insulation layer and electrically connected to the source line via the openings, such that the conductive layer and at least the part of the source line are connected in parallel,
    wherein the source line further comprises a major source line to connect with the source and a plurality of branch lines to supply the power to the light emitting diode of each pixel, and the conductive layer comprises at least a conductor located over the major source line.

* * * * *